US005499282A

United States Patent [19]
Silfvast

[11] Patent Number: 5,499,282
[45] Date of Patent: Mar. 12, 1996

[54] EFFICIENT NARROW SPECTRAL WIDTH SOFT-X-RAY DISCHARGE SOURCES

[75] Inventor: William T. Silfvast, Winter Springs, Fla.

[73] Assignee: University of Central Florida, Orlando, Fla.

[21] Appl. No.: 237,018

[22] Filed: May 2, 1994

[51] Int. Cl.$^6$ ...................................... H05G 2/00
[52] U.S. Cl. .................... 378/119; 378/143; 250/493.1
[58] Field of Search .................. 250/493; 378/119, 378/136, 140, 143; 315/111.01, 111.21, 111.81, 358

[56] References Cited

U.S. PATENT DOCUMENTS

| | | | |
|---|---|---|---|
| 4,229,708 | 10/1980 | Mani et al. | 331/94.5 G |
| 4,538,291 | 8/1985 | Iwamatsu | 378/119 |
| 4,592,056 | 5/1986 | Elton | 372/5 |
| 4,860,328 | 8/1989 | Frankel et al. | 378/34 |
| 4,872,189 | 10/1989 | Frankel et al. | 378/119 |
| 5,117,432 | 5/1992 | Nilsen | 372/5 |
| 5,177,774 | 1/1993 | Suckewer et al. | 378/43 |
| 5,243,638 | 9/1993 | Wang et al. | 378/119 |
| 5,327,475 | 7/1994 | Golovanivsky et al. | 378/34 |

OTHER PUBLICATIONS

"Line Spectra of the Elements," *CRC Handbook of Chemistry and Physics*, 59th ed., CRC Press Inc., Boca Raton Fla. pp. E 224, 225 229–271.

Silfvast et al. Simple metal–vapor recombination lasers using segmented plasma excitation, Appl. Phys. Lett. 36(8), Apr., 1980, pp. 615–617.

Marconi et al., Time–resolved extreme ultraviolet emission from a highly ionized lithium capillary discharge, Appl. Phys. Lett. 54(22), May, 1989, pp. 2180–2182.

Rocca et al., Study of the Soft X–ray Emission from Carbon Ions in Capillary Discharge, IEEE Journ. Quantum Electr., vol. 29 #1, Jan. 1983, pp. 182–191.

Nagata et al., Soft–X–Ray Ampl. of the Lyman Transition by Optic.–Field Induced Ioniz., American Physical Soc., vol. 71, #23, Dec. 1983, pp. 3774–3777.

Silfvast, William T., Development of Effic. Narrow Spectr. Width Soft–X–Ray Sources at 13.5nm, CREOL/Univ. Central Fla., Jan. 1994, pp. 1–5.

Silfvast, William T., Development of a Contin, Narrow Spectr. Width Soft–X Ray Sources at 13.5nm, CREOL/Univ. Central Fla., Jan. 1994, pp. 1–5.

Silfvast et al., Laser Plasma Source Charactiz. for SXPL, OSA Proceedings on Soft–X–Ray Proj. Lithog., vol. 18, May 1993, pp. 117–126.

*Primary Examiner*—David P. Porta
*Assistant Examiner*—David Vernon Bruce
*Attorney, Agent, or Firm*—Brian S. Steinberger

[57] ABSTRACT

Methods for making pulsed and continuous discharge plasma light sources for extreme ultraviolet(EUV) projection lithography and soft-x-ray microscopy as well as other applications are disclosed. A first light source of doubly ionized lithium ions emits over a narrow bandwidth of approximately 13.5 nm. A second light source of beryllium ions radiates at approximately 7.60 nm. A third light source of boron ions radiates at approximately 4.86 nm, and a fourth light source of carbon ions radiates at approximately 3.38 nm. Preferred embodiments of apparatus for generating pulsed and continuous discharge sources are disclosed.

16 Claims, 10 Drawing Sheets

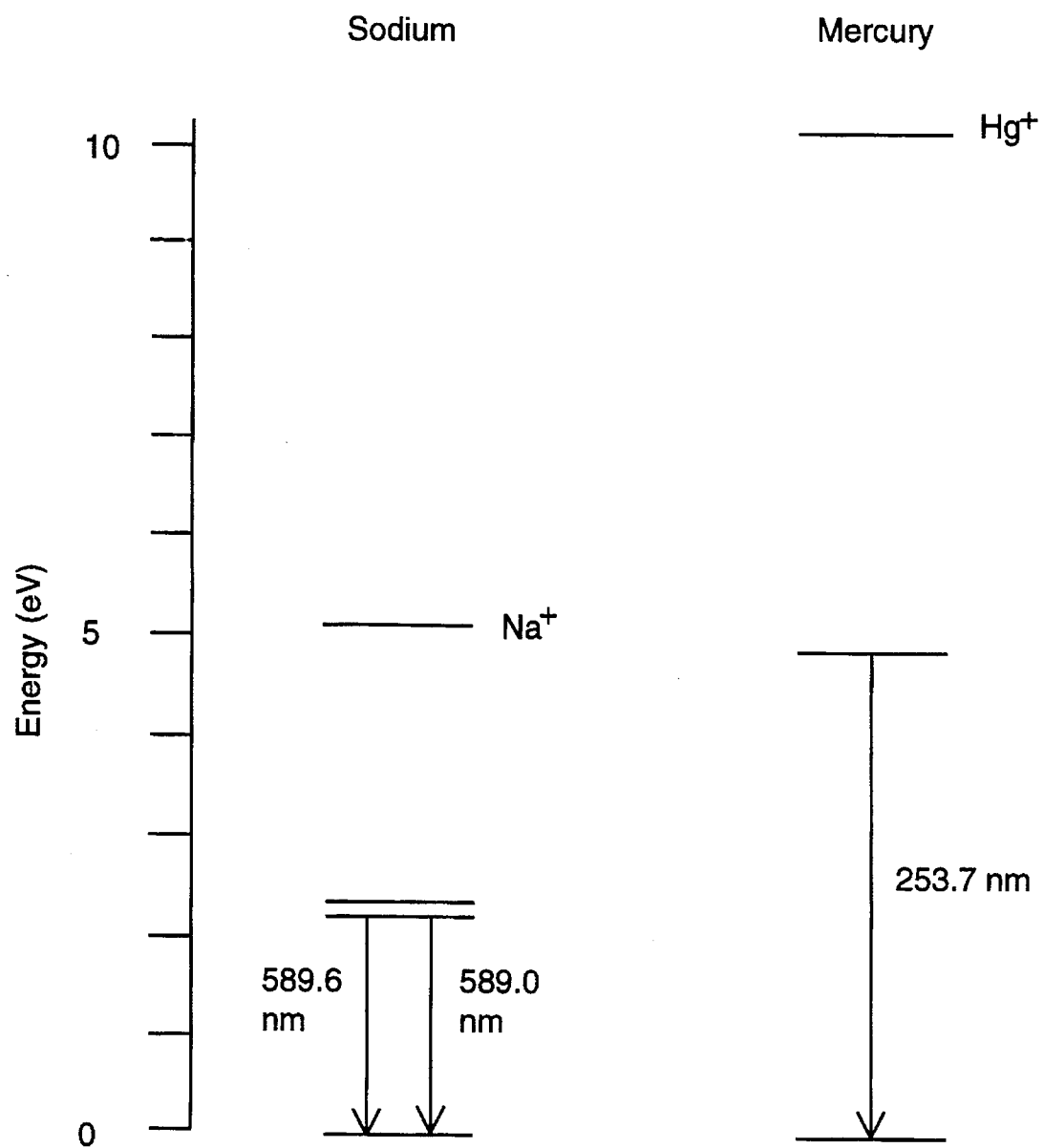
Figure (1)
PRIOR ART

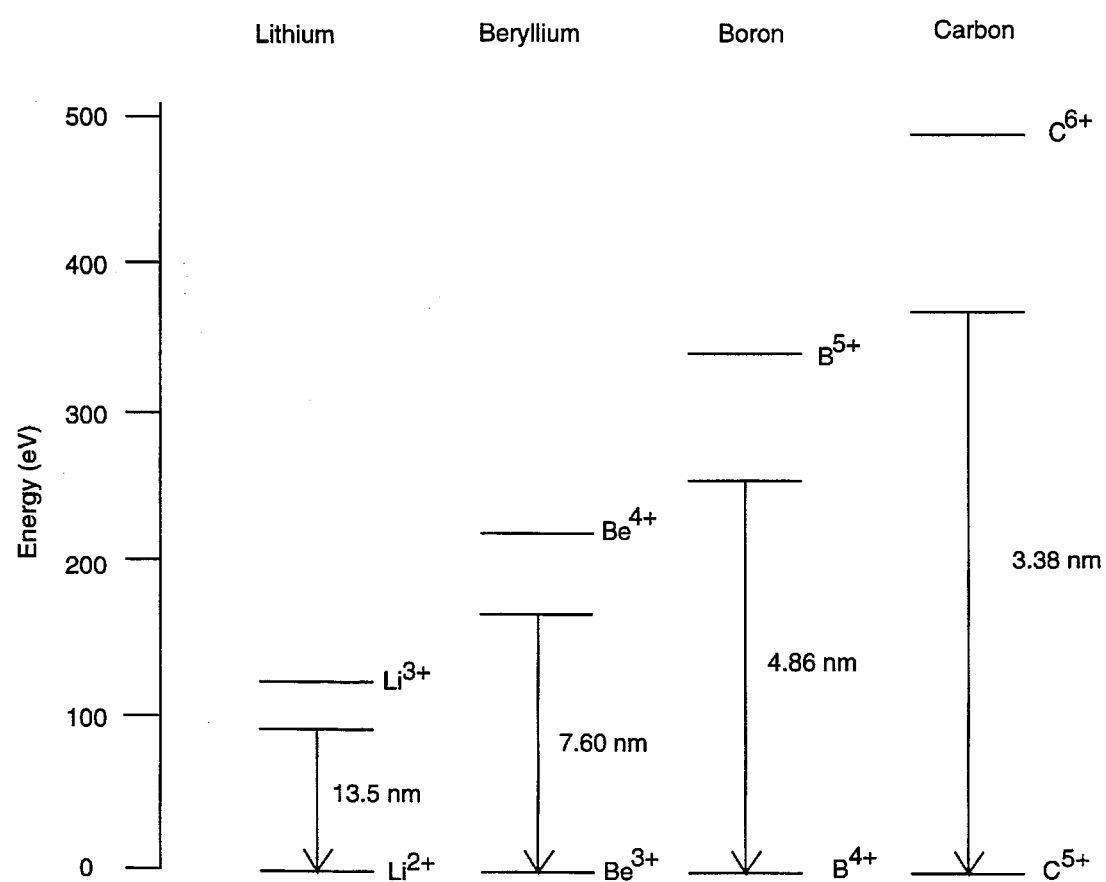
Figure (2)

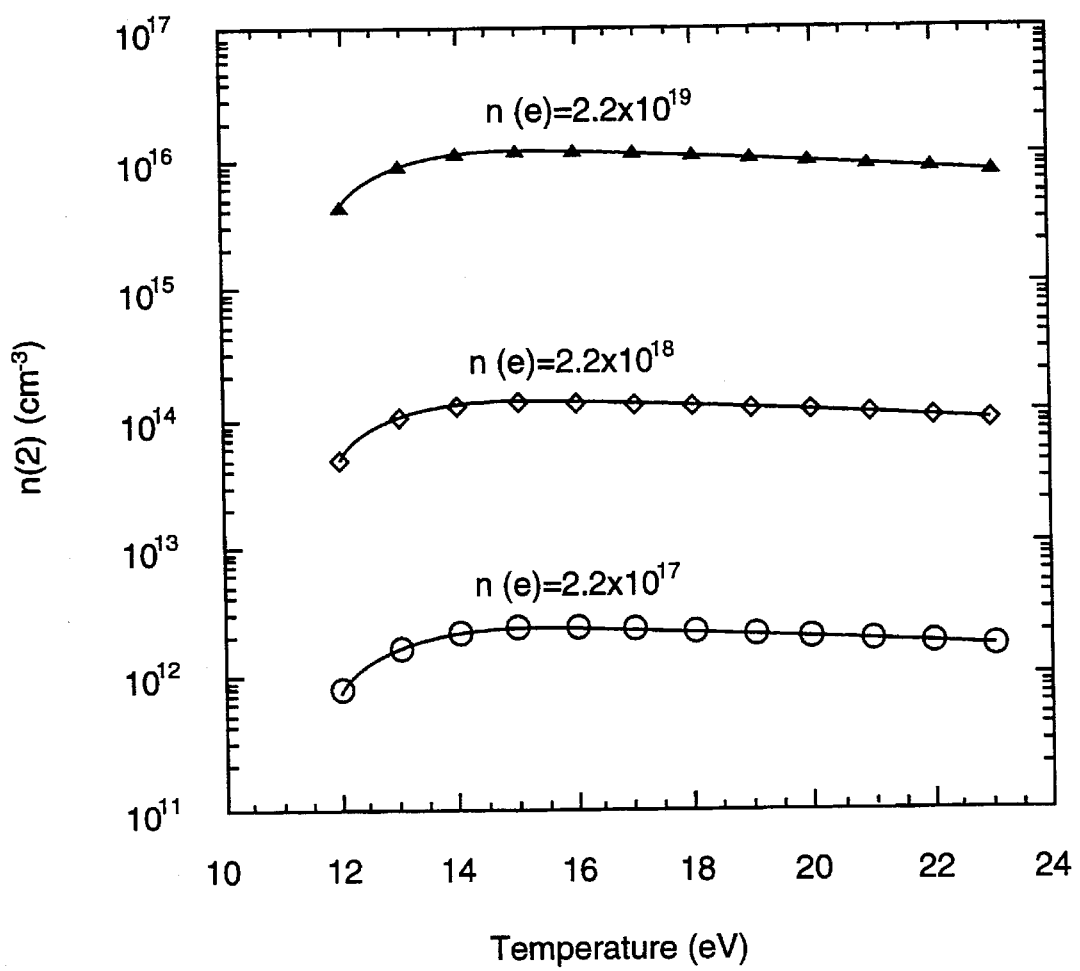
Figure (3)

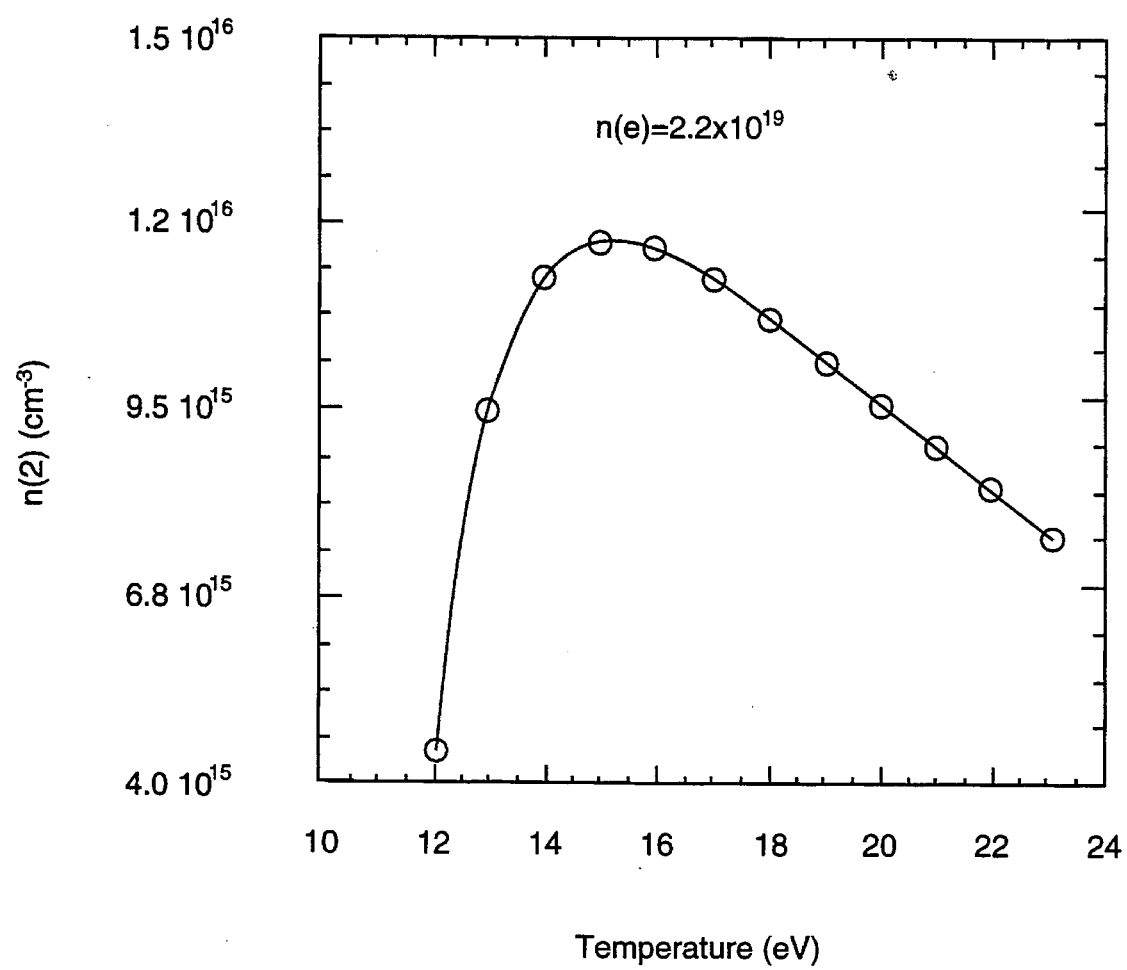
Figure (4)

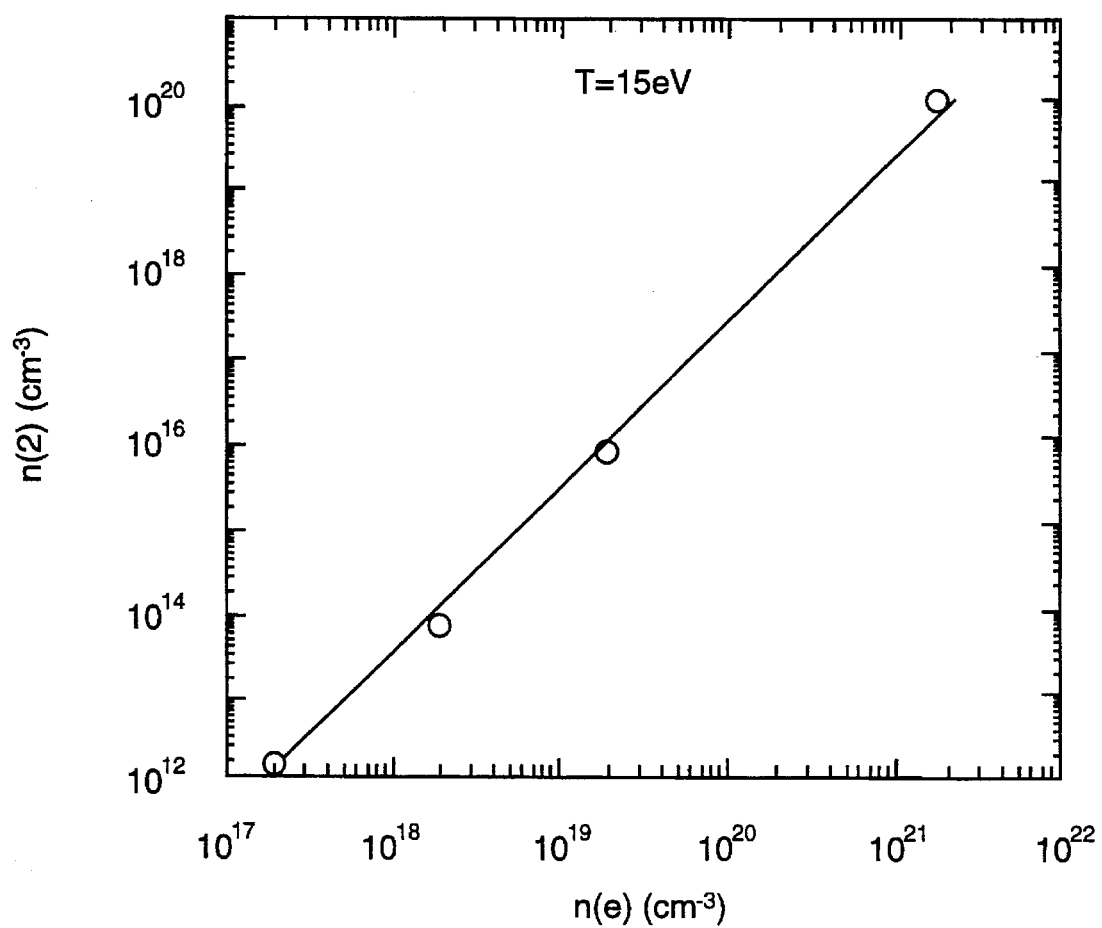
Figure (5)

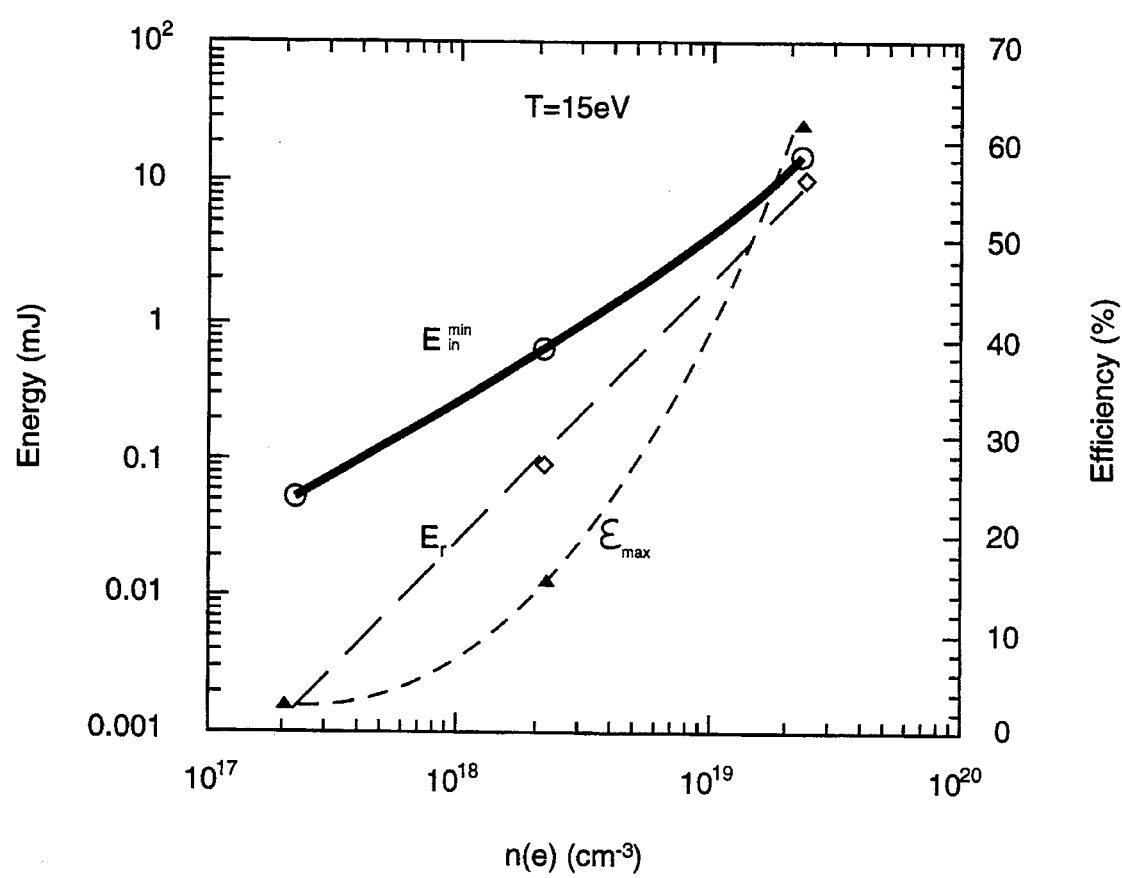
Figure (6)

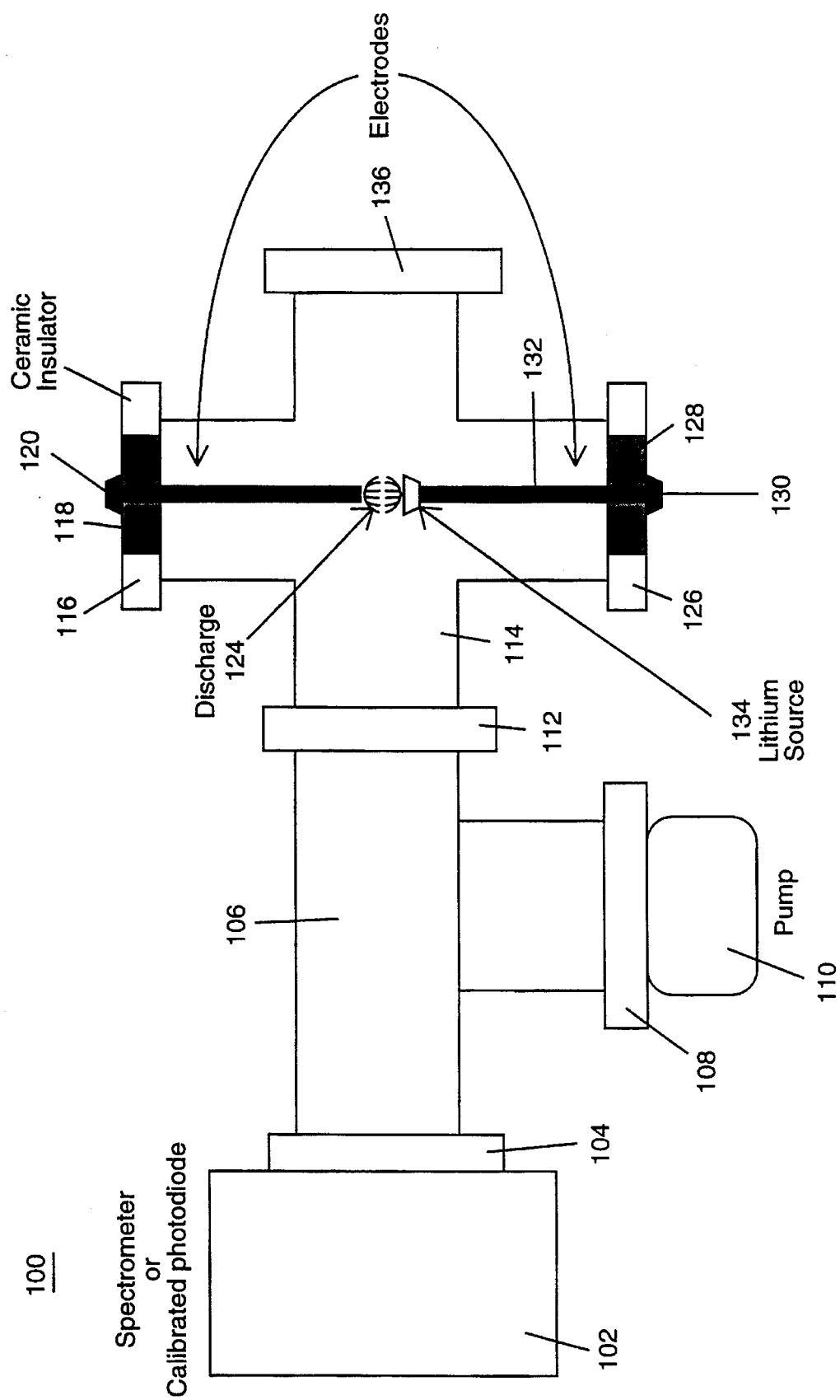
Figure (7)

ELECTRODE CONFIGURATIONS
FOR AN EFFICIENT Li$^{2+}$ 13.5 nm DISCHARGE SOURCE
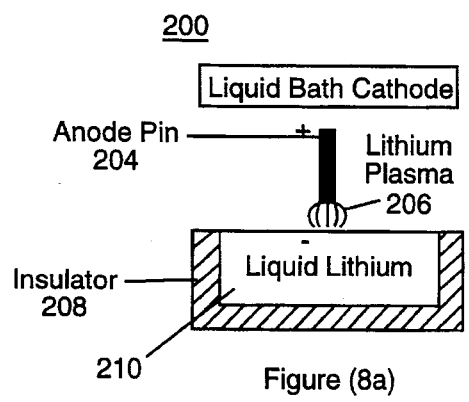
Figure (8a)
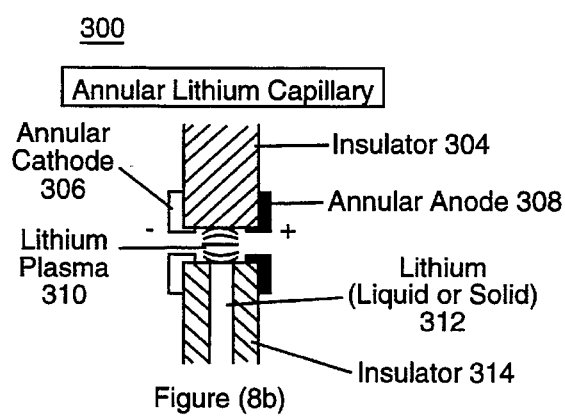
Figure (8b)
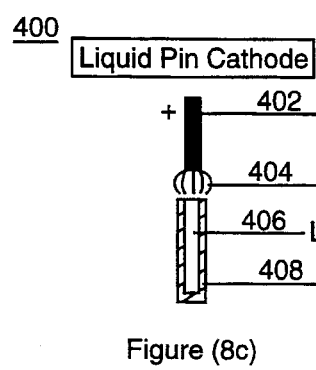
Figure (8c)
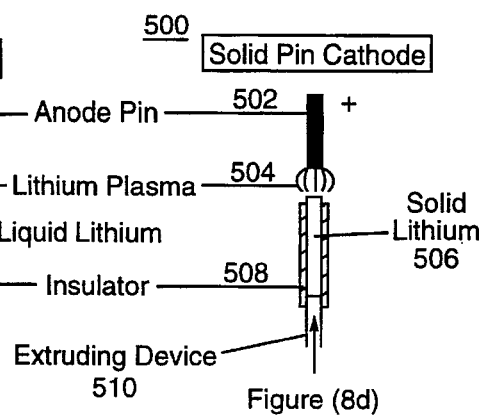
Figure (8d)

Li 13.5 nm Continuous Discharge Source Configurations
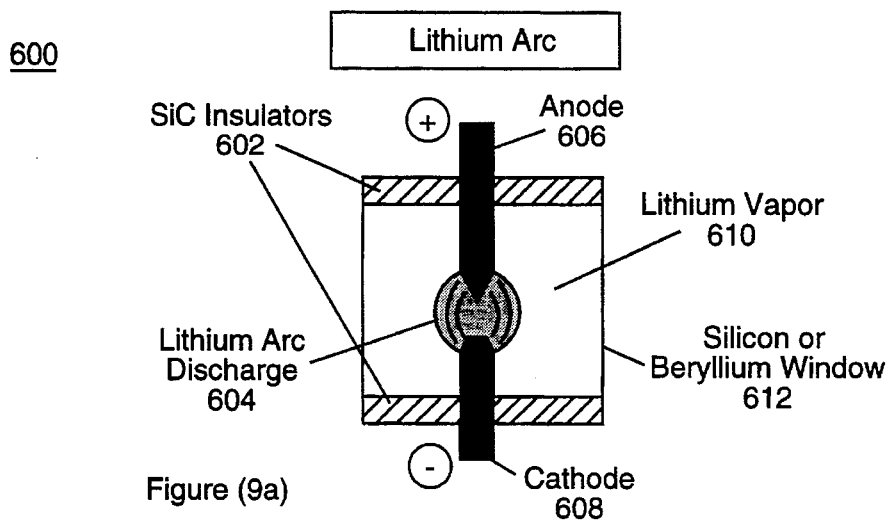
Figure (9a)
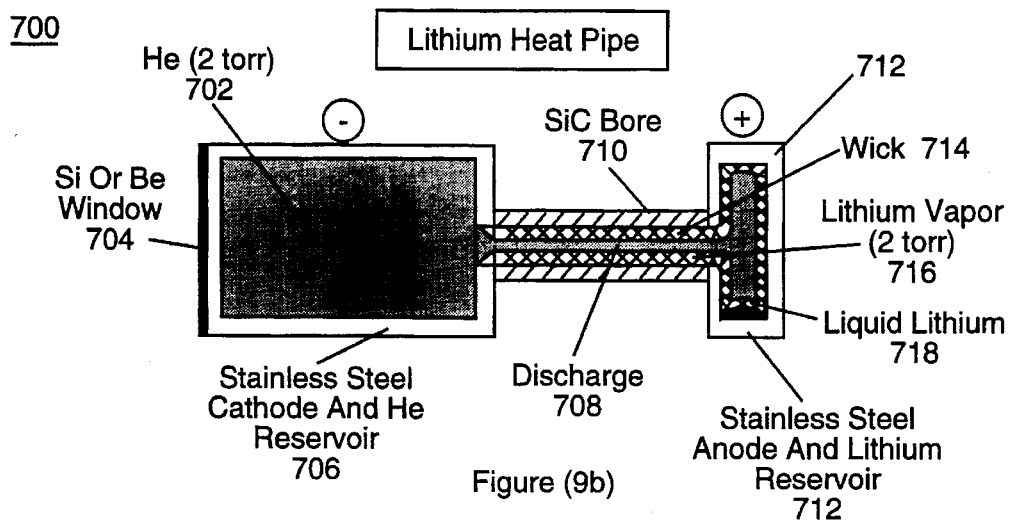
Figure (9b)
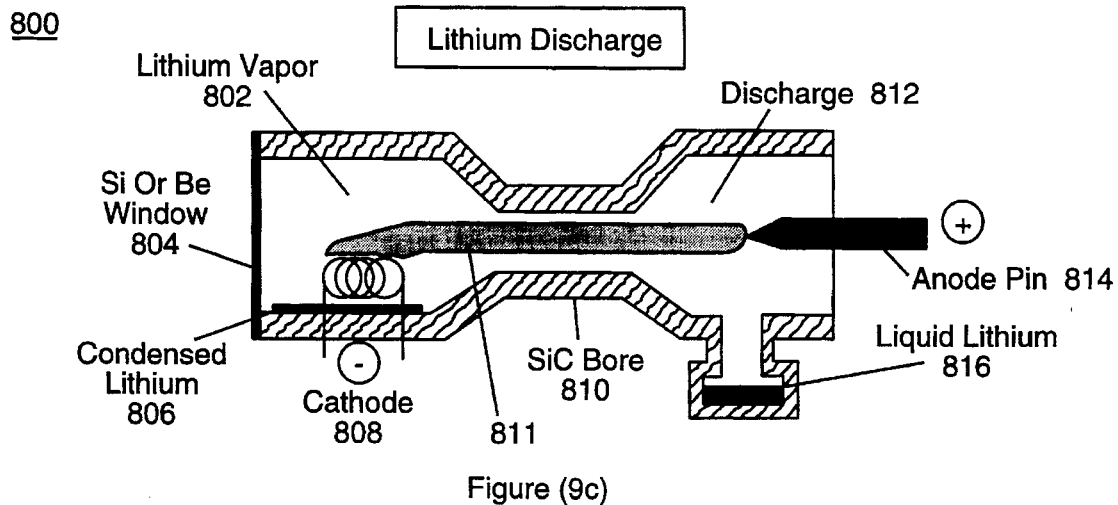
Figure (9c)

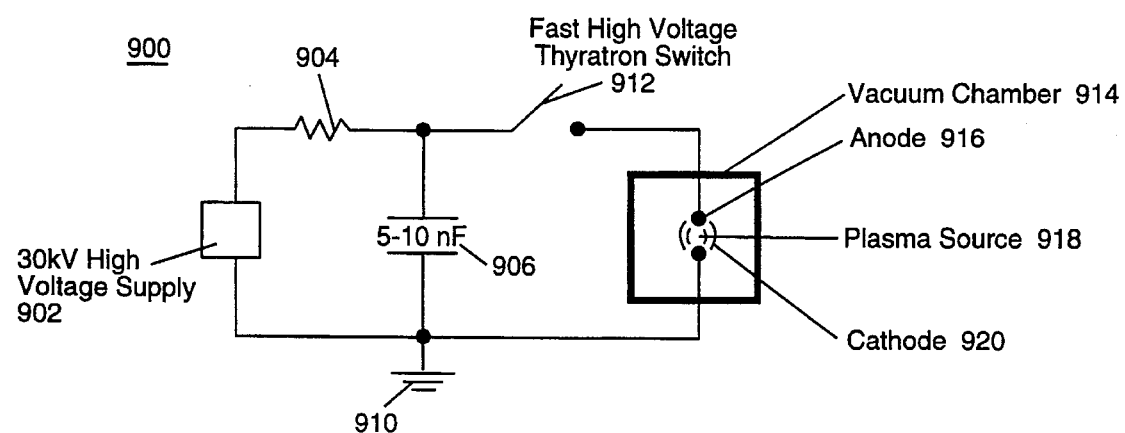
Figure (10)

EFFICIENT NARROW SPECTRAL WIDTH SOFT-X-RAY DISCHARGE SOURCES

This invention relates to discharge sources, and in particular to methods and apparatus for making and producing pulsed and continuous discharge sources for plasma soft-x-ray or EUV projection lithography. This invention was funded in part under contract no. 6503808 from D.O.E. and Sandia National Laboratories and under contract no. 6503810 from A.R.P.A. and Sandia National Laboratories.

BACKGROUND AND PRIOR ART

For soft x-ray or EUV projection lithography there is a need for a soft x-ray plasma source that can radiate within a specific wavelength of approximately 13–14 nm in the EUV part of the spectrum.

Current approaches to the development of an efficient 13–14 nm plasma light source for EUV lithography involve a high repetition-rate laser plasma source produced by the ablation of the source material from a solid target. Such a system falls short of satisfying the needed requirements for EUV lithography in several respects. First, the mass buildup of debris target material on the surface of a condenser mirror used in the lithography systems is many orders of magnitude (greater than $10^3$) larger than the mirror can sustain without loss of reflectivity over a reasonable operating period. Second, the spectral bandwidth of the EUV emission from the plasma is greater than the bandwidth of the multilayer mirror by a large factor, and thus the majority of the EUV emission is absorbed by the mirror. At the repetition rate of a testbed facility the thermal loading of this absorbed energy is sufficient to deform the mirror and degrade its reflectivity. Finally, no engineered scheme has yet been proposed that would guarantee continuous, unimpeded operation of a kilohertz repetition rate target facility at the required predicted cost per shot requirement of less than $10^{-5}$/shot.[3]

The region of 13–14 nm is currently the preferable wavelength range for applications using soft-x-ray light because it is the region of maximum reflectivity of narrow-banded Mo:Si reflective coatings used in conjunction with near normal incidence soft-x-ray reflecting optics. There are currently no compact, efficient continuous or pulsed sources available in this spectral region. For example, the most likely source being presently considered for soft-x-my or EUV lithography operating in that wavelength region is a pulsed laser produced plasma source generated by a 1 kHz repetition rate, 1 J/pulse diode pumped solid state laser which was described by this inventor in the article entitled: "Laser-Produced Plasmas for Soft-X-Ray Projection Lithography," W. T. Silfvast, M. C. Richardson, et. al., J. Vac. Sci. Technol. B 10, 1 (1992). That laser would emit a power at 13 nm of approximately 10 W and would cost well over a million dollars, primarily due to the cost of the laser diodes required to pump the laser. Furthermore, such a laser source would have a wallplug efficiency of less than 0.1%. The lithium source disclosed in this invention would emit the same power at an electron density of $2.5 \times 10^{17}/cm^3$, and would have a wallplug efficiency of the order of 10%. It would probably cost in the neighborhood of $10,000. The lithium source would be extremely compact, would be more similar to the G-line and I-line mercury arc lamps currently used for lithography, in terms of its size and efficiency, than to a laser plasma source, and would probably cost in the neighborhood of $10,000.

Other sources that have been used include synchrotons which can cost upwards of tens of millions of dollars. Synchrotons sources require large, costly facilities and arc expensive to maintain.

Thus, the need exists for a plasma source for generating pulsed or continuous emission that does not require large, costly facilities that are expensive, that are efficient in the 13 to 14 nm wavelength region and that do not produce a significant amount of debris.

SUMMARY OF THE INVENTION

The first objective of the present invention is to provide an inexpensive pulsed or continuous wave discharge source capable of operating in the range of 13 to 14 nm.

The second object of this invention is to provide a compact pulsed or continuous wave discharge source capable of operating in the range of 13 to 14 nm.

The third object of this invention is to provide an efficient pulsed or continuous wave discharge source capable of operating in the range of 13 to 14 nm.

The fourth object of this invention is to provide a discharge source capable of operating in the range of 13 to 14 nm that does not produce damaging debris.

The fifth object of this invention is to generate a narrow band EUV radiation source.

In a first preferred embodiment, a light source of doubly ionized lithium ions emits over a narrow bandwidth at approximately 13.5 nm. Apparatus for the lithium source are disclosed. In a second preferred embodiment, a light source of beryllium ions radiates at approximately 7.60 nm. In a third preferred embodiment, a light source of boron ions radiates at approximately 4.86 nm. In a fourth embodiment, a light source of carbon ions radiates at approximately 3.38 nm.

Further objects and advantages of this invention will be apparent from the following detailed description of a presently preferred embodiment which is illustrated schematically in the accompanying drawings.

BRIEF DESCRIPTION OF THE FIGURES

FIG. 1 shows a graph of the prior art radiation wavelengths with corresponding energy diagrams for mercury and sodium vapor discharge lamp sources.

FIG. 2 shows the radiation wavelengths with corresponding energy diagrams for Lithium, Beryllium, Boron and Carbon according to the invention.

FIG. 3 shows a plot of the resonance level of lithium vs. plasma temperature T for a range of electron densities.

FIG. 4 shows a specific curve indicating the plasma temperature where lithium is optimized.

FIG. 5 shows a plot of the radiating energy level population density verses the plasma electron density.

FIG. 6 shows a plot of the radiation efficiency verses plasma electron density.

FIG. 7 shows an experimental discharge chamber for producing a pulsed lithium plasma discharge source.

FIG. 8a illustrates a liquid bath cathode for a pulsed lithium source.

FIG. 8b illustrates an annular lithium capillary for a pulsed lithium source.

FIG. 8c illustrates a liquid pin cathode for a pulsed lithium plasma source.

FIG. 8d illustrates a solid pin cathode for a pulsed lithium plasma source.

FIG. 9a shows a lithium arc discharge source.

FIG. 9b shows a lithium heat pipe source.

FIG. 9c shows a lithium discharge source.

FIG. 10 illustrates a circuit for DC discharge excitation.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

The sources disclosed in this invention were developed by considering the operation of low pressure mercury and sodium vapor discharge lamps which are two of the most efficient visible and ultraviolet light sources ever developed. FIG. 1 shows the radiation in wavelength of both mercury and sodium vapor discharge lamps. Referring to FIG. 1, the mercury lamp radiates at 253.6 nm and the sodium lamp radiates at 589.0 nm and 589.6 nm. In both cases the radiation is emitted on resonance transitions (from the first optically connected excited state to the ground state) of their respective atoms. The shortest wavelength for resonance radiation in atomic species is the $^1P_1$ to $^1S_0$ helium transition at 58.4 nm which is not of sufficiently short wavelength to be considered a soft-x-ray source. Thus, to develop efficient soft-x-ray sources of the same type as the mercury and sodium lamps, it is necessary to produce them in ionized species. This involves heating the plasma consisting of electrons and ions to a specific temperature to obtain a specific ion stage from which to produce excitation at a desired resonance level.

For identifying efficient pulsed and continuous wave sources in plasmas requires two steps.

(1) Recognize an ion species with a resonance transition that has a high ratio of photon energy to ionization potential of that particular ion species to minimize wasted excitation; and (2) Identify an ion species having the fewest number of electrons removed from the atom, thereby minimizing the energy required to heat the total number of ions and free electrons of the plasma.

The first section will describe identifying pulsed sources in plasmas requiring the above two steps.

PULSED DISCHARGE SOURCES

The first step is satisfied by choosing hydrogen-like species (species with only one electron orbiting around the nucleus). In such cases the energy of the resonance transition comprises 75% of the ionization energy of the atom. The wavelength of transitions associated with resonance lines of H-like ions can be expressed as $\lambda_{res}=121.6$ nm/$Z^2$ where Z is the charge on the nucleus of the ion.

For satisfying the second step Z should be a minimum value since the factor (Z-1) represents the number of free electrons per ion of the desired radiating species produced in the plasma for H-like ions (assuming charge neutrality).

For Z=2, or $He^+ \lambda_{res}=30.4$ nm which is too long a wavelength for most applications using soft-x-ray optics. In addition, $He^+$ would have to be generated in a background gas of He which strongly absorbs the 30.4 nm radiation by photoionization. A source of this class occurs for Z=3 which would be a $Li^{2+}$ resonance source at 13.5 nm, near the peak reflectivity of efficient high-reflecting Mo:Si mirrors. For Z=4 we have a $Be^{3+}$ source at 7.60 nm. For Z=5 there is a $B^{4+}$ source at 4.86 nm and for Z=6 we have a $C^{5+}$ source at 3.38 nm.

FIG. 2 shows the radiation wavelengths with corresponding energy diagrams for Lithium, Beryllium, Boron and Carbon. They all involve hydrogen-like resonance radiation equivalent to the $2p^2P$-$1s^2S$ 121.6 nm Lyman alpha transition in hydrogen.

An estimate of the pulsed source efficiency is as follows. Estimates of the efficiency of using the $Li^{2+}$ source are done as an exemplary calculation since the $Li^{2+}$ source will produce the highest efficiency of the four proposed sources based upon its operation in the lowest ionization stage of the four sources. The efficiency of the $Li^{2+}$ source will be obtained by first estimating the energy $E_r$ radiated from a $Li^{2+}$ plasma for a pulse duration $\Delta\tau_p$ using a collisional radiative hydrogen-like plasma model. Then an estimate of the minimum input energy $E_{in}^{min}$ required to produce such a plasma for that duration based upon considerations of the energy required to heat the electrons and ions and also to raise the internal energy to the appropriate ion stage, is determined if this input energy is realizable in the laboratory. $E_{in}^{min}$ is then compared to some experimental estimates of input energy based upon the voltage and current required to produce such plasmas. The maximum efficiency $\epsilon_{max}$ defined as $\epsilon_{max}=E_r/E_{in}^{min}$ is then computed as a function of electron density.

A specific plasma model for $Li^{2+}$ in which the population in the first excited state (the resonance level) is computed as a function of plasma electron density n(e) and temperature T. The optimum plasma temperature will be determined as that which produces the maximum population in the resonance level for a given plasma electron density. The power and energy radiated from the resonance level can then be calculated as a function of electron density assuming that the plasma is optically thin. Then the effects of plasma thickness or opacity on efficiency will be considered.

Using the hydrogen-like plasma model first developed by Bates, Kingston and McWhirter, in "Recombination Between Electrons and Atomic Ions", Proc. Roy. Soc. A267, 297 (1962) and the refinements made to include excited state populations by McWhirter and A. G. Hearn, in "A Calculation Of The Instantaneous Population Densities of the Excited Levels Of Hydrogen-Like Ions In A Plasma", Proc. Phys. Soc., 82, 641 (1963), we can obtain a plot of the resonance level population n(2) of hydrogen-like $Li^{2+}$ ion vs. plasma temperature T for a range of electron densities n(e). The populations of $Li^{2+}$ and $Li^{3+}$ ground state ions as a function of temperature were approximated from House, in "Ionization Equilibrium Of The Elements From H to Fe", Astrophysical Journal Supplement 7, 307 (1963).

The power radiated $P_r$ from level 2 would then be determined from $$P_r = n(2) V A_{21} h\nu_{21} \quad (1)$$

where V is the plasma volume, $A_{21}$ is the radiative transition probability from level 2 to level 1, h is Planck's constant and $\nu_{21}$ is the frequency of radiation on the 13.5 nm transition. The energy radiated $E_r$ for a plasma emission duration of $\Delta\tau_p$ could then be expressed as $$E_r = n(2) V A_{21} h\nu_{21} \Delta\tau_p \quad (2)$$

FIG. 3 shows a logarithmic plot of n(2) versus plasma temperature T for a range of electron densities. FIG. 4 shows a more detailed curve at $n(e)=2.2\times10^{19}/cm^3$ indicating that $n(2)$ is optimized at a plasma temperature of approximately 15 eV or 175,000 K. This optimum temperature was typical for all $n(e)$ investigated. A plot of $n(2)$ vs. $n(e)$ at T=15 eV is shown in FIG. 5. It can be seen that $n(2)$ increases approximately as the square of the electron density, which is not surprising since the population in level 2 is proportional to both the ground state ion density $N^{2+}$ of $Li^{2+}$ and to $n(e)$, and since $N^{2+} \approx n(e)/2$, we find that $n(2) \propto n(e)^2$.

The value of $n(2)$ vs. $n(e)$ of FIG. 5 can be used to generate $E_r$ for the 13.5 nm transition in $Li^{2+}$ from Equation (2). It is assumed that the plasma is generated in a small cylindrical volume of 125 μm radius by 250 μm length, or a volume of $V=1.2\times10^{-5}$ $cm^3$ which is a typical source size of laser-produced plasmas and a desirable size for use with soft-x-ray imaging optics. Thus for $A_{21}=3.8\times10^{10}/sec$, and $h\nu_{21}=91.8$ eV$=1.5\times10^{-17}$ J, $E_r$ can be computed for a plasma emission duration $\Delta\tau_p$ of 100 nsec to simulate a realistic low-inductance discharge pulse. The energy $E_r$ is shown in FIG. 6 for the volume $V=1.2\times10^{-5}$ as a function of $n(e)$.

The input energy $E_{in}$ required to heat the plasma to the $Li^{2+}$ ionization stage and to produce the radiating species in the first excited state of that ionization stage will now be estimated. In the plasma volume V mentioned above, the number of electrons would be $n(e) V$ and the number of ions would be $N^{2+} V$ each with an energy of $(3/2)kT$. The ionization energy required to reach the $Li^{2+}$ ion ground state (per ion) would b $$E_I = \sum_{i=1}^{2} E_{IP} = 5.4eV + 75.6eV = 81.0eV$$

for the first two ionization energies of Li. Also, the energy required to excite the population up to level 2 for a plasma duration $\Delta\tau_p$ would be equal to the energy radiated from level 2 or $n(2)VA_{21}h\nu_{21}\Delta\tau_p$ for the ideal situation involving 100% excitation and radiating efficiency from the $Li^{2+}$ ground state to the resonance state and back to the ground state. The actual efficiency for this process is probably not too much less than 100% based upon the efficient operation of the mercury and sodium resonance lamps which operate by an identical process.

Thus the minimum input energy $E_{in}^{min}$ required to produce the number of ions in volume V for a duration $\Delta\tau_p$ would be $$E_{in}^{min} \approx n(e)V(3/2)kT + N^{++}V(3/2)kT + N^{++}VE_1 + n(2)VA_{21}h\nu_{21}\Delta\tau_p \quad (3)$$

Since for plasma neutrality $N^{++}=n(e)/2$ we have $$E_{in}^{min} = \left\{ n(e)\left[ \left(\frac{9}{4}\right)kT + \frac{E_I}{2}\right] + n(2)A_{21}h\nu_{21}\Delta\tau_p \right\}V \quad (4)$$

For kT=15eV, $E_I$=81eV, and $V=1.2\times10^{-5}cm^3$, $E_{in}^{min}$ is shown plotted as a function of $n(e)$ in FIG. 6. $E_{in}^{min}$ represents the minimum amount of energy necessary to produce a plasma of $Li^{2+}$ of volume V with the optimum density in the radiating state (the first excited state). The maximum theoretical efficiency $\epsilon_{max}$ for an optically thin plasma can thus be computed by dividing $E_r$ by $E_{in}^{min}$ or $\epsilon_{max}=E_r/E_{in}^{min}$ which is also shown plotted in FIG. 6. We can see that $\epsilon_{max}$ increases super-linearly with $n(e)$. For example at $n(e)=10^{19}/cm^3$ we can see that $E_r=1.72$ mJ and $E_{in}^{min}=4.1$ mJ and therefore $\epsilon_{max}=42\%$. Thus, it appears that it would be desirable to operate at as high an electron density as possible in order to increase the efficiency and also the energy per pulse. We will see later that this efficiency is limited by the plasma opacity. For plasmas of this size and electron density the plasma becomes optically thick and the emission will eventually broaden beyond the acceptable bandwidth of the soft-x-ray optics. We estimate that this will occur for $n(e) \approx 10^{19}/cm^3$ and thus $\epsilon_{max}$ in FIG. 6 is probably not realistic for $n(e)$ values much higher than this.

The estimate for $E_{in}^{min}$ obtained above does not take into account the amount of energy that might be required to maintain the plasma in the $Li^{2+}$ ionization stage for any specific duration $\Delta\tau_p$ such that level 2 will continue to radiate. However, for short pulse durations of the order of 200 nsec, this estimate may be sufficient. In order to see if this calculation is realistic, we will compare $E_{in}^{min}$ with some experimental estimates of the energy input that we believe would be required to produce such a plasma. Experiments by J. Rocca, M. C. Marconi and F. G. Tomasel, in "Study Of The Soft X-Ray Emission From Carbon Ions In A Capillary Discharge", IEEE J. Quant. Electron. 29, 182 (1993), to make short wavelength lasers in pulsed capillary discharges in materials such as lithium, carbon and other materials, have produced 1 cm long, 0.5 mm diameter cylindrical plasmas with temperatures as high as 66 eV and electron densities greater than $10^{19}/cm^3$. Such plasmas were obtained by applying a high current through the capillary under conditions of vacuum or very low pressure gas. The current was provided by discharging a low inductance capacitor through the capillary with a capacitance ranging from 5–100 nF initially charged to voltages of up to 40 kV.

Based upon these results and knowledge of requirements for other plasma discharges, we estimate that a 250 μm long 125 μm diameter $Li^{2+}$ plasma with a temperature of 15 eV could be produced with an electron density of up to $10^{19}/cm^3$ by discharging a 0.1–10 nF capacitor initially charged to a voltage of 10 kV. If we assume the lowest capacitance and a 100 nsec duration plasma pulse, the plasma would have a current of 15 A (>30,000 $A/cm^2$) and an energy input $E_{in}$ of 5 mJ which is not much higher than that estimated in FIG. 6 for $E_{in}^{min}$. If higher capacitances and voltages are require, the efficiency would of course be reduced proportionately.

In order to compare these efficiencies to that produced by a laser produced plasma we would have to reduce $E_r$ by a factor of 2 to simulate the 2 π steradian solid angle of the emission of a laser plasma. This would lead to a conversion efficiency of 21% compared to the projected best laser plasma efficiencies of from 0.1% to 0.2%. We are thus estimating a possible increase in the conversion efficiency of up to a factor of several hundred for the lithium source as compared to the best projected laser plasma source (based upon an optimistic 10% efficient YAG laser).

A laser produced Sn plasma might produce as much as 10 mJ/pulse within the bandwidth of a multilayer mirror from a plasma volume with dimensions of 250μm. This is based upon an input laser energy of 1 J/pulse and a conversion efficiency from laser input to radiation into a 2 π steradian solid angle of 1%[6]. The plot in FIG. 5 for $E_r$ indicates that the $Li^{2+}$ source would radiate approximately 4 mJ/pulse into a 4 π solid angle or 2 mJ/pulse into a 2 π solid angle at $n(e)=1.4\times10^{19}/cm^{-3}$ for the same size plasma. Thus to produce the equivalent average flux from the same volume as that from the laser plasma, the discharge plasma source would have to be operated at a repetition rate 5 times higher than the laser plasma or 5 kHz. From FIG. 6 we can see that the input energy/pulse for those conditions would be approximately 8 mJ. The total average input power based upon $E_{in}^{min}=8$ mJ and a 5 kHz repetition rate would be 40 W. This is a dramatic difference from the 50–100kW or more required to operate a 1 kHz, 1J/pulse YAG laser.

For such discharge heated plasmas, losses will always occur at electrodes and other components associated with the plasma production. For the mercury and sodium discharge lamps this extraneous loss only amounts to 30%. It may be possible that such a low additional loss might also be achieved in these higher ionized plasmas. Also, it is not known whether a small plasma volume of the order of 250 μm dimensions can be excited to the required temperature and density. Larger plasma volumes with dimensions of up to 1 mm may have to be generated. The plasma would still radiate with the same total efficiency but the useful plasma volume for some applications would be smaller and thus the useful conversion efficiency might be reduced. Nevertheless the efficiency would still be much higher than that of a laser plasma source and the entire source apparatus would be much simpler and less expensive than a combined laser and plasma design.

The Doppler width of the 13.5 nm $Li^{2+}$ transition, at a plasma temperature of 175,000 K, would be 0.0015 nm which is approximately a factor of 400 narrower than the bandwidth of typical multilayer high-reflecting mirrors. We do not expect significant Stark broadening for this transition. We must however consider opacity broadening. The absorption cross section for the $Li^{2+}$ source at 13.5 nm is $4\times10^{-15}$ $cm^2$. Thus if the plasma is operated at an electron density of $10^{19}$ $cm^3$, the $Li^{2+}$ ground state density would be of the order of $5\times10^{18}/cm^3$ and thus the plasma would be optically thin for depths of the order of 1 μm. However the plasma emission on the desired resonance transition could broaden by a factor of 400 due to radiation trapping and still fall within the multilayer mirror bandwidth. The effect of opacity broadening would reduce the effective decay rate in Equations (1) and (2) but it would also increase n(2) by approximately the same factor thus maintaining the same emission rate as estimated from Equation (2). Thus plasma sizes of up to 400 μm may still provide the same efficiency of emission that lies within a multilayer mirror bandwidth for an opacity broadened line as for an optically thin plasma. Such dimensions are larger than the 250 μm source discussed in this paper and thus opacity broadening should not be a problem. The next section will describe identifying continuous wave sources in plasmas.

CONTINUOUS DISCHARGE SOURCES

Similar to identifying pulse sources in plasmas, two steps are required for identifying continuous wave sources in plasmas.

(1) Recognize an ion species with a resonance transition that has a high ratio of photon energy to ionization potential of that particular ion species to minimize wasted excitation; and (2) Identify an ion species having the fewest number of electrons removed from the atom, thereby minimizing the energy required to heat the total number of ions and free electrons of the plasma.

For these steps, lithium again was chosen to exemplify a continuous discharge source.

The First Step is satisfied by choosing hydrogen-like species in which the energy of the resonance transition comprises 75% of the ionization energy of the atom. The wavelength of transitions associated with resonance lines of H-like ions can be expressed as $\lambda_{res}=121.6$ nm/$Z^2$ where Z is the charge on the nucleus of the ion.

In satisfying the second step I want Z to be a minimum since the factor (Z−1) represents the number of free electrons per ion of the desired radiating species produced in the plasma for H-like ions (assuming charge neutrality). For Z=3, the source occurs in a doubly ionized Li plasma ($Li^{2+}$) and radiates at 13.5 nm as shown in FIG. 2. Other possible sources operating at shorter wavelengths are also shown in FIG. 2.

The flux radiating at 13.5 nm from the $Li^{2+}$ source is estimated by calculating the power radiated from the resonance level for a specific plasma volume. These calculations were made by using a collisional-radiative hydrogen-like plasma model first developed by Bates, Kingston and McWhirter in "Recombination Between Electrons and Atomic Ions", D. R. Bates, A. E. Kingston and R. W. P. McWhirter, Proc. Roy. Soc. A267, 297 (1962). The refinements made to include excited state populations were developed by McWhirter and Hearn in "A Calculation Of The Instantaneous Population Densities of the Excited Levels Of Hydrogen-Like Ions In A Plasma", R. W. P. McWhirter and A. G. Hearn, Proc. Phys. Soc., 82, 641 (1963).

The populations of $Li^{2+}$ and $Li^{3+}$ ground state ions as a function of temperature were approximated from House in "Ionization Equilibrium Of The Elements From H to Fe", L. L. House, Astrophysical Journal Supplement 7, 307 (1963). The population density n(2) of the $Li^{2+}$ resonance level obtained from these calculations is shown in FIG. 3 as a function of plasma temperature for a range of electron densities and in FIG. 4 for a specific electron density of $n(e)=2.2\times10^{17}/cm^3$. The optimum plasma electron temperature for a continuous discharge source is 15 eV, which is the same as for a pulsed source. The power radiated can be estimated from the simple relationship $$P_r = n(2) V A_{21} h\nu_{21} \tag{1}$$

For a cylindrical volume of dimensions of 250 μm (V=1.2×$10^{-5}cm^3$), chosen to approximate the size of a laser-produced plasma source, the power radiated into 2 π steradians (to be able to compare with that emitted from a laser plasma) as a function of electron density is shown in FIG. 5. The source will produce 0.02 W at an electron density of $n(e)=10^{16}/cm^3$ and over 2W at $n(e)=10^{17}/cm^3$.

Continuous argon ion lasers have operated at electron densities of up to $n(e)=5\times10^{15}/cm^3$ at electron temperatures of up to 7–8 eV as described in "An Experimental Investigation of Partial LTE for Lower Excited Levels of Ar(I) in a Wall-Confined, Argon Arc Plasma", H. Shingo and S. Imazu, J. Quant. Spectrosc. Radiat. Transfer, 23,605 (1980). Other wall confined continuous argon arc discharges have been operated at electron densities of $n(e)=3\times10^{16}/cm^3$ so it appears that a continuous electron density of $n(e)=10^{17}/cm^3$ might be achievable.

The energy level arrangements of lithium atoms and ions are conducive to producing the necessary electron temperature of 15 eV as discussed in "Basic Data of Plasma Physics", Second Edition, S. C. Brown, The MIT Press, Cambridge Mass. (1967). The ionization process would take place in two steps. The first would be to produce single ions of lithium. The first ionization potential is 5.4 eV and thus all of the lithium atoms should be readily ionized in the discharge. The second step is to produce double ions. The first excited state of the He-like $Li^+$ ion is over 60 eV above the ion ground state. Since the average electron energy is determined by this energy gap, an average electron energy of 15 eV should readily be obtained to provide the necessary electron temperature required for the $Li^{2+}$ source. As discussed in "Laser-Produced Plasmas for Soft-X-Ray Projection Lithography," W. T. Silfvast, M. C. Richardson, et. al., J. Vac. Sci. Technol. B 10, 1 (1992), an equivalent ratio of average electron energy to excited state energy of 1:4 is readily achieved in a helium discharge.

DISCHARGE SOURCE APPARATUS

FIGS. 7 through 10 illustrate various discharge source apparatus that utilize for example, doubly ionized lithium as the light source.

FIG. 7 shows an experimental discharge chamber 100, for producing a pulsed lithium plasma discharge source. The various elements that make up the chamber are now described. Element 102 is a spectrometer or calibrated photodiode. 104 is a connecting flange. 106 is a pump manifold. 108 is a connecting flange. 110 is a pump such as a turbo molecular pump. 112 is a connecting flange. 114 is a source chamber. 116 is a connecting flange. 118 is a ceramic insulator. 120 is an electrical connector. 122 is an anode. 124 refers to the plasma discharge. 126 is a connecting flange. 128 is a ceramic insulator. 130 is an electrical connector. 132 is an cathode. 134 is a pool of liquid or solid Lithium source.

In reference to FIG. 7, the pump 110 is used to evacuate the chamber of air since air is not compatible with lithium since air oxidizes the lithium. The spectrometer and calibrated photodiode 102 are used to evaluate the emission intensity and spectrum from the lithium plasma source. The lithium pulsed plasma discharge 124 occurs between the two electrodes 122 and 132 which serve as the anode and cathode respectively. A high voltage is applied at connecting points 120 and 130 to cause a current to flow in the discharge region 124. The ceramic insulators 118 and 128 serve to electrically isolate the high voltage pulsing system from the ground potential.

The lithium is introduced into the plasma in several different ways including:

1. Heating the chamber to the required lithium vapor pressure or from 10–760 Torr lithium or a temperature range of 900° to 1300° C.

2. Using the arrangement 200, of FIG. 8a in which the lithium is vaporized from a liquid bath of lithium 210 to form the lithium plasma 206 between the anode pin 204 and the liquid bath of lithium 210. In FIG. 8a, element 202 is a liquid bath cathode of lithium. 204 is a anode pin made up of material such as tungsten. 206 is a lithium plasma. 208 is an insulator such as a high temperature ceramic material. 210 is liquid lithium.

3. Using an arrangement 300, of FIG. 8b in which an insulator 304 composed of an insulating material such as silicon, silicon nitride or silicon carbide (preferably non-oxygen containing material) forms the confining region for the pulsed discharge. An annular anode 308 or an anode pin (not shown) composed of a high temperature material such as tungsten serves as the anode or positive voltage terminal of the pulsed source. In FIG. 8b, element 304 is an insulator such as a high temperature ceramic material. 306 is an annular cathode such as tungsten. 308 is an annular anode such as tungsten. 310 is the lithium plasma. 312 is lithium in either solid or liquid form. 314 is an insulator such as a ceramic material. An annular cathode 306 or a cathode pin or hot cathode filament composed of tungsten serves as the cathode or negative electrical terminal of the pulsed lithium source. The lithium could be introduced into the annular region as shown in FIG. 8b by having a liquid pool or a solid rod of lithium 312 surrounded by an insulating material. The lithium is continually supplied to the annular region while the discharge is pulsing.

4. A narrow liquid lithium pin 400, in FIG. 8c that is similar in most respects to the liquid lithium bath of FIG. 8a except that is a narrow liquid lithium 406 rather than a large liquid bath 210. It is surrounded by an insulating material that is preferably non-oxygen containing material since oxygen reacts with lithium to oxidize it. In FIG. 8c, element 402 is an anode pin such as tungsten. 404 is a lithium plasma. 406 is liquid lithium. 408 is an insulator such as a high temperature ceramic material. The anode pin 402 and the lithium plasma 404 are similar to those of FIG. 8a.

5. The electrode arrangement 500, of FIG. 8d is similar to those of FIG. 8c and 8a with the exception that a solid pin lithium cathode 506 is used to provide the lithium vapor and also serve as the cathode. Lithium should be a good cathode material since lithium metal has a very low work function and thus should be a good emitter of electrons. Lithium should also vaporize easily for the same reason. In FIG. 8d, element 502 is an anode pin such as tungsten. 504 is lithium plasma. 506 is solid lithium. 508 is an insulator such as a high temperature ceramic material. 510 is an extruding device. An extruding device as indicated in FIG. 8d would push the lithium upward as it is used up during the pulsing process to provide new lithium material as needed since the lithium would be vaporized to form the discharge and then dissipate out of the plasma source region.

FIGS. 9a through 9c show three embodiments of a continuous lithium discharge source. In all three embodiments the lithium would have to be heated to a temperature in the region of 625° to 900° C. corresponding to a lithium vapor pressure of from 0.1 to 12 Torr to provide the appropriate number of lithium ions for the discharge.

FIG. 9a shows a lithium arc discharge in which there is a discharge source chamber 600 that is composed of insulating materials 602 such as silicon carbide (non-oxygen containing materials) with a silicon or beryllium window 612 to let the 13.5 nm plasma emission exit from the lamp. The window 612 would be a silicon or beryllium material of an approximate thickness of 0.5 to 2 micrometers thick so as to allow sufficient transmission of the 13.5 nm light. The discharge region in the form of an arc discharge 604 is composed of an anode pin 606 and a cathode pin 608 across which a high voltage is initiated. The region 610 between the anode 606 and cathode 608 pins as well as other regions within the chamber 600 is filled with lithium vapor 610 at the necessary temperature as described above for a continuous lithium discharge source. The lithium arc discharge plasma 604 occurs in the region 610 between the anode pin 606 and the cathode pin 608 as shown in FIG. 9a.

FIG. 9b shows a lithium heat pipe discharge source 700. The lithium pipe discharge source is used if it is desirable to keep the silicon or beryllium window 704 at a cool temperature relative to the hot temperature required for the lithium discharge. In such a configuration the cool region 702 is filled with helium at the same pressure as that desired for the lithium vapor 716 in the hot region. The liquid lithium 718 is then vaporized by heating the discharge region 708 in SiC bore 710 to a temperature at a desired vapor pressure. The lithium vapor 716 will fill the discharge region and will condense at the end of the discharge region 708 and flow back to the liquid lithium source 718 via the wick material 714 such as stainless steel or nickel. The silicon or beryllium window 704 are of the same thickness as described above for the lithium arc discharge of FIG. 9a. A discharge current is operated through the discharge region 708 from the anode 712 to the cathode 706.

FIG. 9c shows a lithium high temperature discharge source 800 that operates by injecting the lithium 816 into the anode region 814 and allowing it to flow into the discharge bore region 810. The bore region 810 would be composed of an insulating material 811 such as silicon carbide. An anode pin 814 would serve to introduce the high voltage to cause current to flow from the cathode 808 to the anode 814. The cathode 808 can be a solid cathode or a hot filament type cathode. A silicon or beryllium window 804 would allow the 13.5 nm plasma emission from the lithium discharge plasma 812 to exit the source region at the cathode end 808 of the discharge assembly 800. In this version, liquid lithium 816 would condense 806, in the cathode region 808 from lithium vapor 802 after it flows via cataphoresis from the anode region 814.

FIG. 10 illustrates a typical circuit 900 for DC discharge excitation that can be used with the above apparatus. Element 902 is a 30kV High Voltage Supply. 904 is a resistor such as 10,000 ohms. 906 is a high voltage capacitor of 5 to 10 nF. 910 shows a ground connection. 912 shows a fast high voltage thyratron switch. 914 shows a vacuum chamber such as the one shown in FIG. 5. 916 is an anode such as tungsten. 918 is a lithium plasma source. And element 920 is a cathode such as tungsten.

Although FIGS. 7 through 10 specify lithium as the light source, these discharge sources can also be applicable to beryllium, boron and carbon.

While the invention described herein mentions application for plasma soft-x-ray and EUV lithography, these sources have application in other areas such as but not limited to microchip inspection, biological studies, interferometry, photoprocessing and illumination.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A method of radiating a Lithium ion plasma source at approximately 13.5 nm comprising the steps of:

forming a plasma source substantially composed of $Li^{2+}$ ions; and radiating the plasma source at approximately 13.5 nm.

2. The method of radiating the Lithium ion plasma source of claim 1, wherein the source is used for:

extreme ultraviolet(EUV) projection lithography.

3. The method of radiating the Lithium ion plasma source of claim 1, wherein the source is used for:

soft-x-ray microscopy.

4. The method of radiating the Lithium ion plasma source of claim 1, wherein the plasma further includes:

an operating electron temperature range of 12 to 20 eV; and an electron density of $10^{16}$ to $10^{21}$ $cm^3$.

5. The plasma source of claim 1, wherein the radiating source is:

a pulsed signal.

6. The plasma source of claim 1, wherein the radiating source is:

a continuous source.

7. A method of radiating a carbon ion plasma source at approximately 3.38 to 3.6 nm, comprising the steps of:

a plasma source composed of predominantly $C^{5+}$ ions; and radiating the plasma source at approximately 3.38 to 3.6 nm.

8. A method of radiating a beryllium ion plasma source at approximately 7.6 nm, comprising the steps of:

forming a plasma source composed of predominantly $Be^{3+}$ ions; and radiating the plasma source at approximately 7.6 nm.

9. A method of radiating a boron ion plasma source at approximately 4.86 nm comprising the steps of:

forming a plasma source composed of predominantly $B^{4+}$ ions; and radiating the plasma source at approximately 4.86 nm.

10. A pulsed discharge source comprising:

lithium;

an anode; and an insulator for supporting the lithium, wherein a pulsed lithium plasma is generated between the anode and the insulator.

11. The pulsed discharge source of claim 10, wherein the lithium further includes:

liquid lithium.

12. The pulsed discharge source of claim 10, wherein the lithium further includes:

solid lithium.

13. The pulsed discharge source of claim 10, wherein the anode further includes: anode pin.

14. The pulsed discharge source of claim 10, wherein the anode further includes:

an annular anode.

15. The pulsed discharge source of claim 10, further comprising:

an extruding device.

16. A continuous plasma discharge source comprising:

lithium;

an anode;

a cathode; and an insulator having a silicon carbide bore, wherein a continuous plasma is generated in a region between the anode and the cathode.

* * * * *